US010101362B2

(12) United States Patent
Ku et al.

(10) Patent No.: US 10,101,362 B2
(45) Date of Patent: Oct. 16, 2018

(54) PROBE MODULE WITH HIGH STABILITY

(71) Applicant: MPI CORPORATION, Zhubei (TW)

(72) Inventors: Wei-Cheng Ku, Zhubei (TW); Hao Wei, Zhubei (TW); Yu-Hao Chen, Zhubei (TW); Chih-Hao Ho, Zhubei (TW)

(73) Assignee: MPI CORPORATION, Zhubei (TW)

( * ) Notice: Subject to any disclaimer, the term of this patent is extended or adjusted under 35 U.S.C. 154(b) by 0 days.

(21) Appl. No.: 14/553,590

(22) Filed: Nov. 25, 2014

(65) Prior Publication Data

US 2015/0168453 A1 Jun. 18, 2015

(30) Foreign Application Priority Data

Dec. 13, 2013 (TW) .............................. 102146091 A

(51) Int. Cl.
*G01R 1/067* (2006.01)
(52) U.S. Cl.
CPC ................................ *G01R 1/06772* (2013.01)
(58) Field of Classification Search
CPC ...... G01R 3/00; G01R 1/067; G01R 1/06738; G01R 1/06711; G01R 31/2886; G01R 1/07307
USPC ... 324/437, 445, 446, 754.01–754.02, 754.1, 324/755.01–755.02
See application file for complete search history.

(56) References Cited

U.S. PATENT DOCUMENTS

| 3,179,904 | A | * | 4/1965 | Paulsen | H01B 7/08 174/117 R |
| 4,697,143 | A | * | 9/1987 | Lockwood | G01R 1/07342 324/750.27 |
| 6,375,492 | B1 | * | 4/2002 | Hio | H01R 12/68 439/422 |
| 6,933,713 | B2 | * | 8/2005 | Cannon | H01R 13/625 324/72.5 |
| 8,608,504 | B2 | * | 12/2013 | Tseng | H01R 9/034 439/326 |
| 9,759,746 | B2 | * | 9/2017 | Ku | G01R 3/00 |
| 2001/0018291 | A1 | * | 8/2001 | Aoki | H01R 12/592 439/499 |
| 2006/0043959 | A1 | * | 3/2006 | Cavoretto | G01R 1/067 324/72.5 |

(Continued)

FOREIGN PATENT DOCUMENTS

WO WO2007/137241 A2 11/2007

*Primary Examiner* — Alesa Allgood
(74) *Attorney, Agent, or Firm* — Lynette Wylie; Apex Juris, pllc.

(57) ABSTRACT

A probe module, which is provided between a tester and a DUT for transmitting electrical signals therebetween, includes a signal transmitting member, a plurality of probes, a positioning member, and a signal connector. The signal transmitting member has a circuit and two grounding. The probes are electrical connected to the circuit and the groundings of the signal transmitting member. The positioning member is made of an insulating material, and provided on the probes. The signal connector is adapted to be electrically connected to the tester, wherein the signal connector has a signal transmission portion and a grounding portion; the signal transmission portion is electrically connected to the circuit of the signal transmitting member, and the grounding portion is electrically connected to the at least one grounding of the signal transmitting member.

4 Claims, 4 Drawing Sheets

(56) References Cited

U.S. PATENT DOCUMENTS

| | | | |
|---|---|---|---|
| 2008/0036484 A1* | 2/2008 | Lee | G01R 1/06722 |
| | | | 324/755.05 |
| 2008/0164900 A1* | 7/2008 | Ku | G01R 1/06772 |
| | | | 324/755.07 |
| 2010/0253377 A1* | 10/2010 | Strid | G01R 1/06772 |
| | | | 324/755.08 |
| 2012/0190217 A1* | 7/2012 | Tseng | H01R 9/034 |
| | | | 439/55 |
| 2012/0270441 A1* | 10/2012 | Bence | H01R 9/05 |
| | | | 439/583 |
| 2012/0274347 A1* | 11/2012 | Wang | G01R 1/06772 |
| | | | 324/755.02 |
| 2014/0318849 A1* | 10/2014 | Ito | H01R 4/182 |
| | | | 174/267 |
| 2015/0168454 A1* | 6/2015 | Ku | G01R 1/06772 |
| | | | 324/750.24 |

* cited by examiner

PROBE MODULE WITH HIGH STABILITY

BACKGROUND OF THE INVENTION

1. Technical Field

The present invention relates to an electrical testing device, and more particularly to a probe module.

2. Description of Related Art

Probe card is the commonest device to test the electrical connection of the electronic. The conventional probe card is electrically connected to a device under test (DUT) and a tester respectively to transmit electrical signals therebetween.

However, the probes might shift for a distance when they are in touch with the pads on the DUTs for many times. The shift of the probes makes an error in positioning the probes, and changes the characters of the electrical signals as well, which causes a false or incorrect detection.

Therefore, to avoid the shift of the probes is an important issue in the electrical test field.

BRIEF SUMMARY OF THE INVENTION

In view of the above, the primary objective of the present invention is to provide a probe module, which has a high stability after times of operations.

In order to achieve the objective of the present invention, a probe module, which is provided between a tester and a DUT for transmitting electrical signals therebetween, includes a signal transmitting member, a plurality of probes, a positioning member, and a signal connector. The signal transmitting member has a circuit and at least one grounding. The probes are made of a conductive material, and electrical connected to the circuit and the at least one grounding of the signal transmitting member respectively. The probes are adapted to touch the DUT. The positioning member is made of an insulating material, and provided on the probes. The signal connector is adapted to be electrically connected to the tester, wherein the signal connector has a signal transmission portion and a grounding portion; the signal transmission portion is electrically connected to the circuit of the signal transmitting member, and the grounding portion is electrically connected to the at least one grounding of the signal transmitting member.

With such design, the probes are firmly held by the positioning member to avoid the shifting problem.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
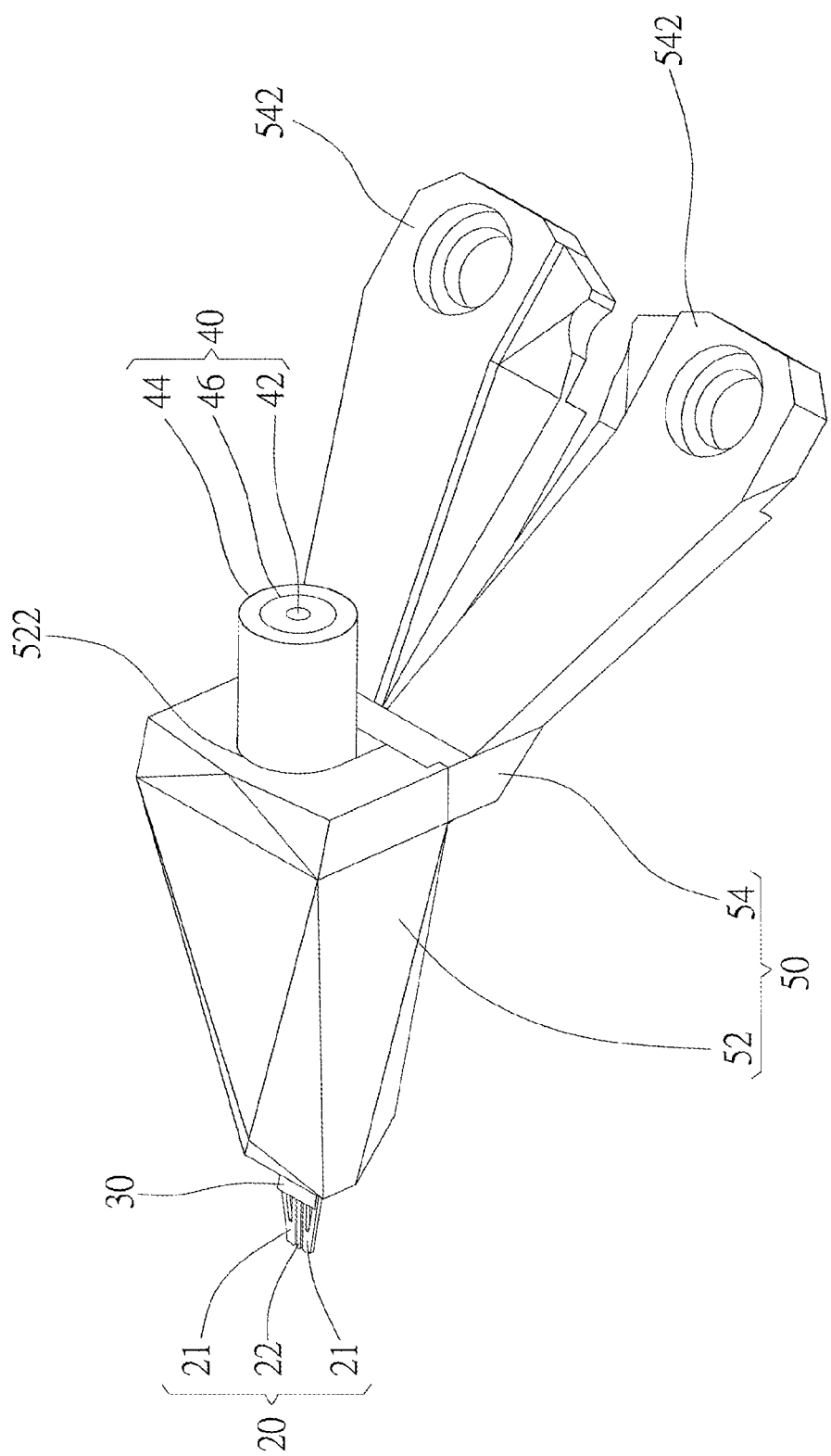
FIG. 1 is a perspective view of a preferred embodiment of the present invention.
Figure 2:
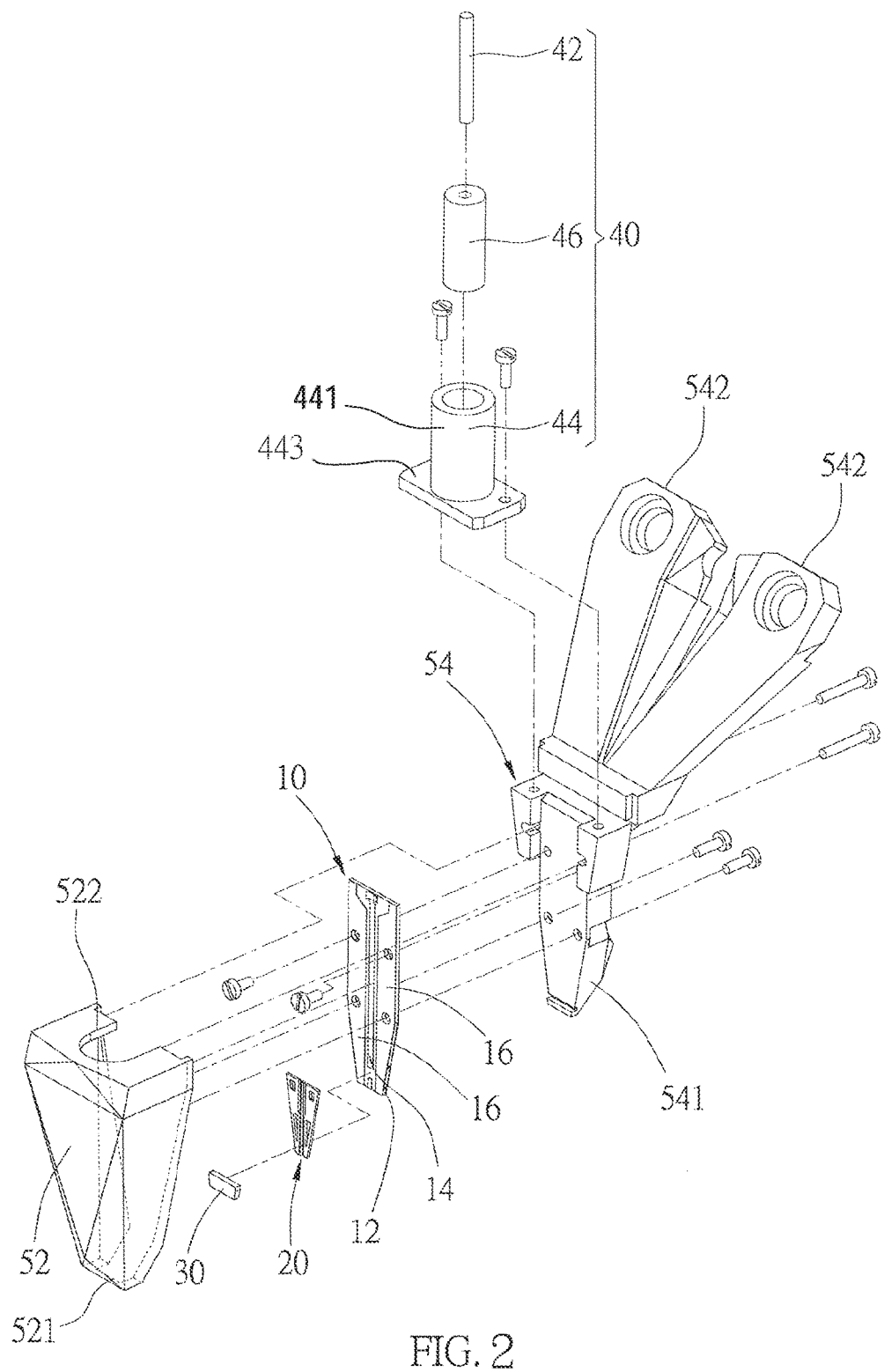
FIG. 2 is an exploded view of the preferred embodiment of the present invention.

As shown in FIG. 1 and FIG. 2, a probe module of the preferred embodiment of the present invention, which is adapted to connect to a tester (not shown) and a DUT (not shown) respectively for transmitting electrical signals, includes a signal transmitting member 10, a probe set 20, a positioning member 30, a signal connector 40, and a housing 50.

The signal transmitting member 10 is a PCB (printed circuit board) in the present embodiment, having a rectangular substrate 12, on which a circuit 14 and two groundings 16 are provided. The circuit 14 is between the groundings 16. In an embodiment, the signal transmitting member 10 could be a coaxial cable, a flexible printed circuit board (FPCB), or other equivalent devices.

Figure 3:
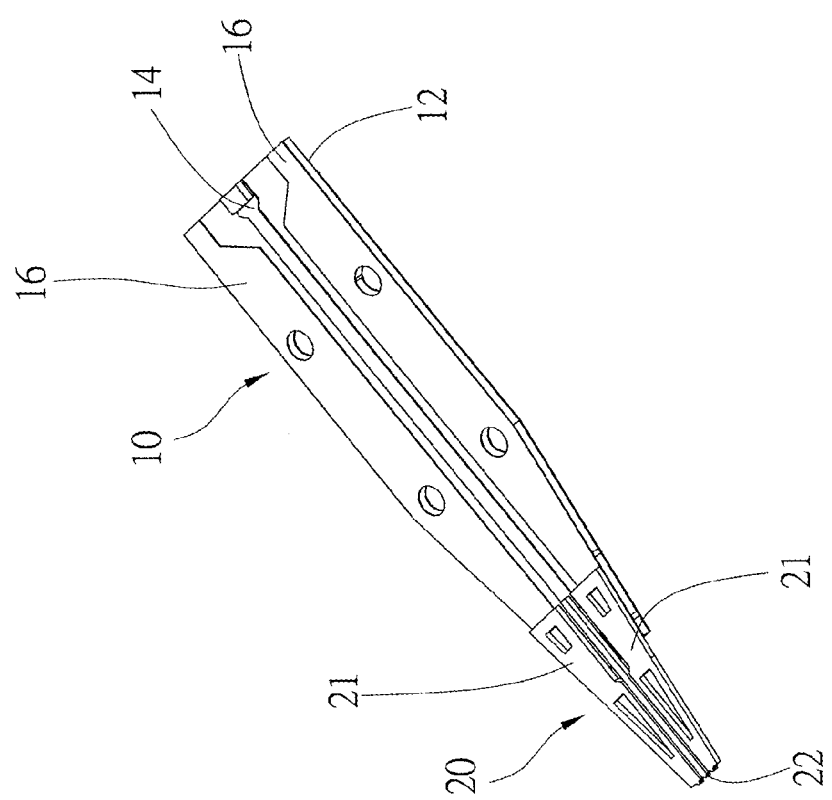
FIG. 3 is a perspective view of the preferred embodiment of the present invention, showing the probe set on the PCB.

As shown in FIG. 3, the probe set 20 has three conductive probes, two of which are grounding probes 21, and the third of which is a signal probe 22. The probes are adapted to touch specific pads (not shown) on the DUT. A size of each grounding probe 21 is greater than that of the signal probe 22. Ends of the grounding probes 21 are fixed to the substrate 12 by welding, and electrically connected to the groundings 16 respectively. The signal probe 22 is fixed to the substrate 12 by welding as well, and electrically connected to the circuit 14. Therefore, the signal probe 22 is between the grounding probes 21.

The signal connector 40 is connected to the signal transmitting member 10, and has a signal transmission portion 42 and a grounding portion 44. The signal transmission portion 42 is electrically connected to the circuit 14, and the grounding portion 44 is electrically connected to the grounding 16. In the present embodiment, the signal transmission portion 42 is a metal rod, and the grounding portion 44 includes a metal hollow cylinder 441 and a flange 443. The metal hollow cylinder 441 is positioned surrounding the metal rod of the signal transmission portion 42, and electrically connected to the grounding 16 via the flange 443. An insulating pad 46 is provided between the signal transmission portion 42 and the grounding portion 44 to avoid signal interference or short.

Figure 4:
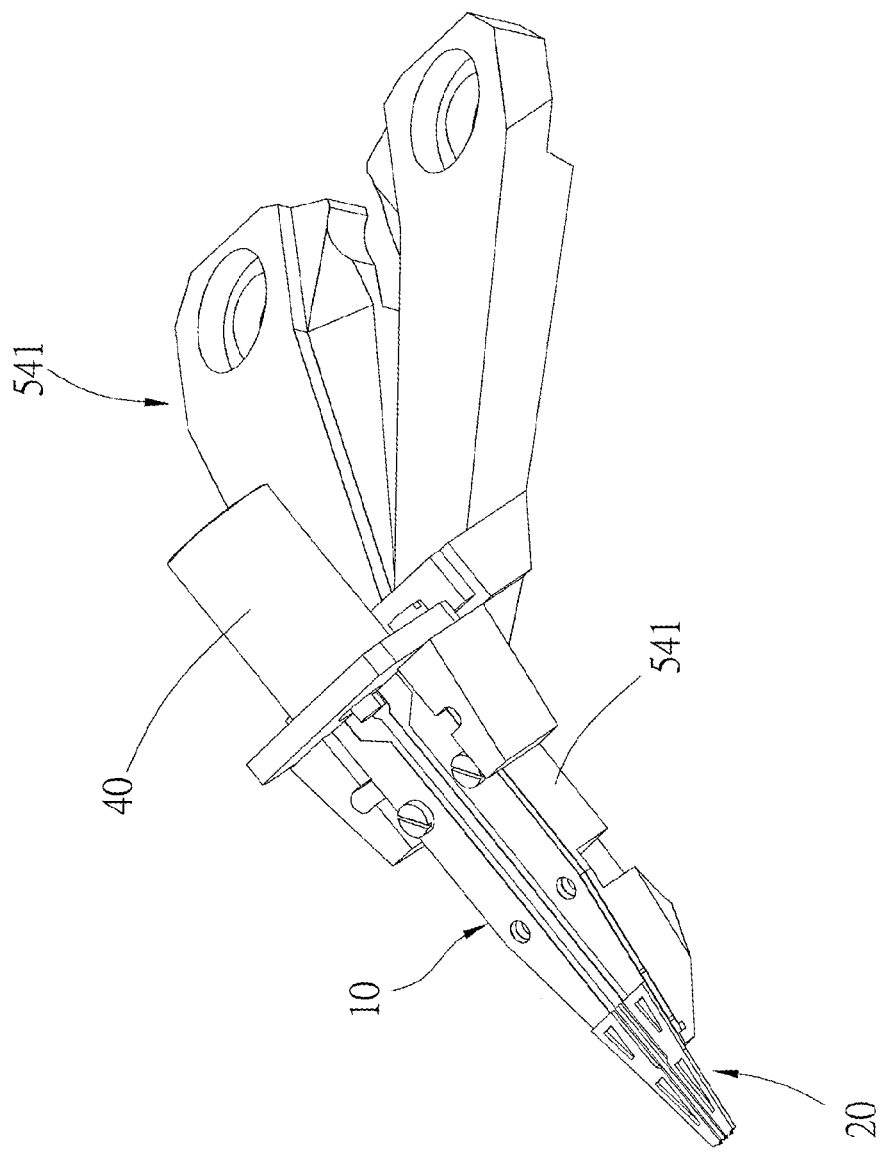
FIG. 4 is a perspective view of the preferred embodiment of the present invention, showing the signal transmitting member on the bottom case.

The housing 50 has a top case 52 and a bottom case 54 connected together to form a room therein. The top case 52 has a first opening 521 and a second opening 522 at opposite ends and communicated with the room. The bottom case 54 has a table 541 and two connecting boards 542 on a side of the table 541. As shown in FIG. 4, the signal transmitting member 10 and the signal connector 40 are fixed to the table 541 of the bottom case 54 by bolts while the probe set 20 and the signal connector 40 are fixed to the signal transmitting member 10. Next, the top case 52 is connected to the table 541 to cover the signal transmitting member 10 on the table 541 thereunder. The probe set 20 extends out of the housing 50 via the first opening 521, and the signal connector 40 extends out of the housing 50 via the second opening 52.

The positioning member 30 is made of epoxy, and is attached to portions of top sides of the probes 21, 22 of the probe set 20, which are out of the housing 50, by an insulating glue. The positioning member 30 crosses the probes 21, 22, and is in gaps between the probes 21, 22. As a result, the positioning member 30 may hold the probes 21, 22 of the probe set 20 firmly at their positions and insulate the probes 21, 22 from each other. In an embodiment, the positioning member 30 is made of other insulating material, and is attached to the probes 21, 22 only, which means that the positioning member 30 is not in the gaps between the probes 21, 22. It achieves the same holding function.

In the beginning of a testing task, the operator secures the boards 542 to a testing arm of the tester, and connects the signal connector 40 to a coaxial cable of the tester. Next, the operator operates the tester to move the testing arm, so that the probe module is moved toward the DUT to make the probes 21, 22 of the probe set 20 touch specific pads of the DUT, and then it may start the testing task. With the positioning member 30, it may hold the probes 21, 22 of the probe set 20 firmly to avoid the shifting problem after plural times of test tasks.

It must be pointed out that the embodiments described above are only some preferred embodiments of the present invention. All equivalent structures which employ the concepts disclosed in this specification and the appended claims should fall within the scope of the present invention.

What is claimed is:

1. A probe module, which is provided between a tester and a DUT for transmitting electrical signals therebetween, comprising:
   a signal transmitting member having a circuit and two groundings;
   a plurality of probes, which are made of a conductive material and adapted to touch the DUT, electrical connected to the circuit and the two groundings of the signal transmitting member respectively;
   a positioning member, which is made of an insulating material, provided on the probes; and
   a signal connector, which is adapted to be electrically connected to the tester, having a signal transmission portion and a grounding portion, wherein the signal transmission portion is electrically connected to the circuit of the signal transmitting member, and the grounding portion is electrically connected to the two groundings of the signal transmitting member;
   wherein the signal transmitting member has a substrate, on which the circuit and the two groundings are provided;
   wherein two of the two groundings are provided on the substrate, and electrically connected to the grounding portion of the signal connector; the circuit is between two of the two groundings;
   wherein the signal transmission portion comprises a metal rod, and the grounding portion comprises a metal hollow cylinder and a flange, the metal hollow cylinder is positioned surrounding the metal rod of the signal transmission portion;
   wherein the positioning member is received in a gap between the probes;
   wherein the metal rod is in contact with the circuit, and the metal hollow cylinder is in contact with the two groundings via the flange.

2. The probe module of claim 1, wherein three of the probes are provided, one of which is electrically connected to the circuit, and the other two of which are electrically connected to the two groundings respectively.

3. The probe module of claim 1, further comprising a housing having a room therein and a first opening and a second opening at opposite ends of the housing and communicated with the room, wherein the signal transmitting member is received in the room;
   the probes extend out of the housing via the first opening, and the signal connector extends out of the housing via the second opening; the positioning member is provided on portions of the probes, which are out of the housing.

4. The probe module of claim 3, wherein the housing has a top case and a bottom case; the signal transmitting member is connected to the bottom case; the bottom case has the first opening and the second opening, and the top case is connected to the bottom case to cover the signal transmitting member.

* * * * *